US008171191B2

(12) United States Patent
Bruce et al.

(10) Patent No.: US 8,171,191 B2
(45) Date of Patent: May 1, 2012

(54) BUS INTERCONNECT DEVICE AND A DATA PROCESSING APPARATUS INCLUDING SUCH A BUS INTERCONNECT DEVICE

(75) Inventors: Alistair Crone Bruce, Stockport (GB); Andrew David Tune, Derbyshire (GB)

(73) Assignee: ARM Limited, Cambridge (GB)

( * ) Notice: Subject to any disclaimer, the term of this patent is extended or adjusted under 35 U.S.C. 154(b) by 108 days.

(21) Appl. No.: 12/309,740

(22) PCT Filed: Aug. 4, 2006

(86) PCT No.: PCT/GB2006/002924

§ 371 (c)(1), (2), (4) Date: Jan. 28, 2009

(87) PCT Pub. No.: WO2008/015371

PCT Pub. Date: Feb. 7, 2008

(65) Prior Publication Data

US 2009/0210594 A1 Aug. 20, 2009

(51) Int. Cl.

| | |
|---|---|
| ***G06F 13/00*** | (2006.01) |
| ***G06F 13/42*** | (2006.01) |
| ***H05K 7/10*** | (2006.01) |
| ***H01P 5/12*** | (2006.01) |
| ***G02B 6/10*** | (2006.01) |

(52) U.S. Cl. ........ 710/100; 710/106; 710/301; 333/113; 385/129

(58) Field of Classification Search .................. 710/100, 710/106, 301; 333/113; 385/129

See application file for complete search history.

(56) References Cited

U.S. PATENT DOCUMENTS

| | | | | |
|---|---|---|---|---|
| 4,200,870 | A * | 4/1980 | Gabbitas | 342/175 |
| 4,721,902 | A * | 1/1988 | Tellerman et al. | 73/610 |
| 5,138,436 | A * | 8/1992 | Koepf | 257/728 |
| 5,268,973 | A * | 12/1993 | Jenevein | 385/14 |
| 5,581,217 | A * | 12/1996 | Macdonald | 333/246 |
| 5,680,041 | A * | 10/1997 | Begin | 324/207.13 |
| 5,959,752 | A * | 9/1999 | Ota | 398/119 |
| 6,320,543 | B1 * | 11/2001 | Ohata et al. | 343/700 MS |
| 6,332,050 | B1 * | 12/2001 | Feldman et al. | 385/24 |
| 6,421,021 | B1 * | 7/2002 | Rupp et al. | 343/753 |
| 6,512,618 | B1 * | 1/2003 | Heflinger | 385/37 |
| 6,914,787 | B2 * | 7/2005 | Ajioka et al. | 361/816 |
| 6,949,707 | B1 * | 9/2005 | Tonomura | 174/390 |

(Continued)

FOREIGN PATENT DOCUMENTS

EP 1055264 A1 * 11/2000

(Continued)

OTHER PUBLICATIONS

Rohit Nair; Muzammil Iqbal; Tian Gu; Michael W. Haney; , "Coupling Structure for Intrachip Optical Global Communication: Design and Simulation," Lasers and Electro-Optics Society, 2006. LEOS 2006. 19th Annual Meeting of the IEEE , pp. 815-816, Oct. 2006.*

(Continued)

*Primary Examiner* — Faisal M Zaman

(74) *Attorney, Agent, or Firm* — Nixon & Vanderhye P.C.

(57) ABSTRACT

A bus interconnect device is provided comprising a parallel plate waveguide for coupling together a plurality of devices. This provides an efficient and flexible approach for providing interconnect functionality within a data processing apparatus.

13 Claims, 4 Drawing Sheets

U.S. PATENT DOCUMENTS

| | | | | |
|---|---|---|---|---|
| 6,980,066 | B2 * | 12/2005 | Nakai et al. | 333/128 |
| 7,236,070 | B2 * | 6/2007 | Ajioka et al. | 333/247 |
| 7,248,757 | B2 * | 7/2007 | Iwasaki | 385/14 |
| 7,327,924 | B2 * | 2/2008 | Brueck et al. | 385/129 |
| 7,617,342 | B2 * | 11/2009 | Rofougaran | 710/100 |
| 7,844,156 | B2 * | 11/2010 | Ohtsu et al. | 385/129 |
| 7,899,287 | B2 * | 3/2011 | Haga et al. | 385/45 |
| 7,969,001 | B2 * | 6/2011 | Rofougaran et al. | 257/728 |
| 2003/0223202 | A1 | 12/2003 | Uchida | |
| 2005/0001721 | A1 * | 1/2005 | Houston et al. | 340/539.22 |
| 2005/0074241 | A1 * | 4/2005 | Farmer et al. | 398/72 |
| 2005/0085209 | A1 * | 4/2005 | Hiramatsu et al. | 455/328 |
| 2006/0187863 | A1 * | 8/2006 | Kenny et al. | 370/296 |
| 2006/0209924 | A1 | 9/2006 | Molisch et al. | |
| 2007/0147475 | A1 | 6/2007 | Yamamoto | |
| 2008/0089640 | A1 * | 4/2008 | Beausoleil | 385/24 |
| 2009/0220240 | A1 * | 9/2009 | Abhari et al. | 398/81 |
| 2010/0226609 | A1 * | 9/2010 | Tokushima | 385/50 |
| 2011/0006662 | A1 * | 1/2011 | Kwon et al. | 313/317 |

FOREIGN PATENT DOCUMENTS

| | | | |
|---|---|---|---|
| EP | 1 361 671 | | 11/2003 |
| EP | 1 396 902 | | 3/2004 |
| EP | 1 587 141 | | 10/2005 |
| GB | 2 402 761 | | 12/2004 |
| JP | 7-202761 | | 8/1995 |
| JP | 2001-141949 | | 5/2001 |
| JP | 2003-344679 | | 12/2003 |
| JP | 2005080281 | A * | 3/2005 |
| JP | 2005-102024 | | 4/2005 |
| JP | 2005102024 | A * | 4/2005 |
| JP | 2006-074432 | | 3/2006 |
| JP | 2006-191602 | | 7/2006 |
| WO | WO 9609662 | A1 * | 3/1996 |
| WO | WO 2004017454 | A1 * | 2/2004 |
| WO | WO 2009108137 | A1 * | 9/2009 |

OTHER PUBLICATIONS

Tian Gu; Nair, R.; Haney, M.W.; , "Prismatic Coupling Structure for Intrachip Global Communication," Quantum Electronics, IEEE Journal of , vol. 45, No. 4, pp. 388-395, Apr. 2009.*

Tosik, G.; Gaffiot, F.; Lisik, Z.; O'Connor, I.; Tissafi-Drissi, F.; , "Power dissipation in optical and metallic clock distribution networks in new VLSI technologies," Electronics Letters , vol. 40, No. 3, pp. 198-200, Feb. 5, 2004.*

Sekar, V.; Armendariz, M.; Entesari, K.; , "A 1.2-1.6-GHz Substrate-Integrated-Waveguide RF MEMS Tunable Filter," Microwave Theory and Techniques, IEEE Transactions on , vol. 59, No. 4, pp. 866-876, Apr. 2011.*

International Search Report for PCT/GB2006/002924, mailed Jul. 11, 2007.

Written Opinion of the International Searching Authority for PCT/GB2006/002924, mailed Jul. 11, 2007.

Suntives, Asanee et al., "Investigation of the Performance of an EBG Waveguide-base Interconnect Used as a High-speed Serial Link", IEEE Workshop on Signal Propagation on Interconnects, (May 2006), pp. 71-74.

Suntives, A. et al., "Transition Structures for EBG Waveguide-based Interconnects", Electrical Performance of Electronic Packaging, (Oct. 24-26, 2005), pp. 147-150.

Uehimura, H. et al., "A Ceramic Planar 77GHz Antenna Array", Microwave Symposium Digest, vol. 2, No. 13, (Jun. 1999), pp. 453-456.

Huang, Y. et al., "An Integrated LTCC Laminated Waveguide-to-Microstrip Line T-Junction", IEEE Microwave and Wireless Components Letters, vol. 13, No. 8, (Aug. 2003), pp. 338-339.

Ito, R. et al, "Parallel Plate Waveguide with Radiating Slot Modeling Using Two Dimensional Frequency Domain Transmission Line Matrix Method", Electrical Performance of Electronic Packaging, (Oct. 27, 2003), pp. 67-70.

Clenet, Michel et al., "Laminated Waveguide as Radiating Element for Array Applications", IEEE Transactions on Antennas and Propagation, vol. 54, No. 5, (May 5, 2006), pp. 1481-1487.

Wu, K. et al., "LTCC Technology and its Applications in High Frequency Front End Modules", Antennas, Propagation and EM Theory, 2003. Proceedings, (Oct. 28-Nov. 1, 2003), pp. 730-734.

Saastamoinen, I. et al., Interconnect IP for Gigascale System-on-Chip, (4 pages).

Dobkin, R. et al., Fast Asynchronous Bit-Serial Interconnects for Network-on-Chip, (4 pages).

Advanced Micro Devices, Inc., "HyperTransport™ Technology: Simplifying System Design", AMD Technology Evangelism, (Oct. 2002), pp. 1-22.

Balachandran, J. et al., "Package Level Interconnect Options", SLIP'05, (Apr. 2-3, 2005), pp. 21-27.

Chang, M. F. et al, "RF/Wireless Interconnect for Inter- and Intra-Chip Communications", Proceedings of the IEEE, vol. 89, No. 4, (Apr. 2001), pp. 456-466.

Chang, M. F. et al., "Advanced RF/Baseband Interconnect Schemes for Inter- and Intra-ULSI Communications", IEEE Transactions on Electron Devices, vol. 52, No. 7, (Jul. 2005), pp. 1271-1285.

Kim, J. et al., "A 5.6-mW 1-Gb/s/pair Pulsed Signaling Transceiver for a Fully AC Coupled Bus", IEEE Journal of Solid-State Circuits, vol. 40, No. 6, (Jun. 2005), pp. 1331-1340.

Zhao, Dan et al., "A New Distributed Test Control Architecture with Multihop Wireless Test Connectivity and Communication for GigaHertz System-Chips", pp. 1-11.

Margala, Martin, "A New Test Control Architecture for Future SoCs Using On-chip Wireless", 2 pages.

Rogers, Shawn, "Novel Technology Eliminates High Frequency Noise in Parallel Plate Power Planes", Bluetooth Americas, (Dec. 9-11, 2003), pp. 1-25.

Abhari, R. et al. "Physics-Based CAD Models for the Analysis of Vias in Parallel-Plate Environments", IEEE Transactions on Microwave Theory and Techniques, vol. 49, No. 10, (Oct. 2001), pp. 1697-1707.

List of Cited References issued Jan. 7, 2011 in corresponding Japanese application.

English translation of Official Action mailed Jan. 7, 2011 in JP 2009-522317.

* cited by examiner

BUS INTERCONNECT DEVICE AND A DATA PROCESSING APPARATUS INCLUDING SUCH A BUS INTERCONNECT DEVICE

This application is the U.S. national phase of International Application No. PCT/GB2006/002924, filed 4 Aug. 2006, which designated the U.S., the entire contents of which are hereby incorporated by reference.

TECHNICAL FIELD

The present invention relates to a bus interconnect device and to a data processing apparatus including such a bus interconnect device, and in particular to a technique for improving bus interconnect devices.

BACKGROUND

The design of components for a data processing apparatus is a labour intensive task, and becomes more complex as data processing apparatus increase in complexity. One such component is a bus interconnect which is used to define the bus connections between various other components within the data processing apparatus. In particular, the bus interconnect will define the bus infrastructure that allows a number of master devices to access a number of slave devices. As data processing apparatus increase in complexity, the number of master and slave devices to be interconnected increases, as do the number of ways in which those master and slave devices can be connected. This significantly increases the complexity of the design of the bus interconnect, and in particular the various connections specified by the bus interconnect.

As geometries of electrical circuitry shrink and clock frequencies increase, parasitic (second and higher order) effects (such as those produced by resistance and capacitance) become increasingly significant within the interconnect. In particular, in addition to propagation delay within the interconnect, parasitic losses contribute significantly to the latency of the interconnect. To seek to alleviate delay within the interconnect, buffers can be added in the communication paths of the interconnect to improve speed of propagation of signals, but such buffers increase power consumption. Further, such delays complicate attainment of data coherency at selected points in the system.

Conventional interconnect techniques require a significant amount of extra effort at the physical layout stage to adequately buffer the data paths and to remove skew between clock and data. As a result routing is complex and expensive due to the number of layers required.

When designing data processing apparatus, particularly with system-on-chip (S-o-C), it is becoming increasingly difficult to achieve the desired clock rates with current interconnect techniques. The AMBA-2 AHB bus has already reached its limit and is being superseded by AMBA-3 where register slices (described in UK patent application GB2402761A and incorporated herein by reference) are expected to alleviate the timing closure problems experienced during chip layout.

Some studies have suggested using telecommunications style packet routing (see for example the article “Interconnect IP for Gigascale System-on-Chip”, by I. Saastamoinen et al, Tampere University of Technology, Institute of Digital and Computer Systems), often based on very high data rate, bit-serial, physical layers (see for example the article “Fast Asynchronous Bit-Serial Interconnects for Network-on-Chip”, VLSI Systems Research Center, Electrical Engineering Department). Whilst such approaches can reduce the wiring requirement of the interconnect (due to the serial communication), such interconnects are difficult to design and are based on point-to-point communication.

Further, none of the above prior art approaches address the underlying process problems of high resistance and capacitance.

It is especially difficult to achieve high data rates when the interconnect is “off-chip”, that is where the interconnect passes data between the chip and another device. The parasitic inductance of the chip pins and the relatively large distances that the data signals need to traverse all conspire to slow the maximum clock rate. LVDS (low voltage differential signalling) has been used in standards such as HyperTransport™ [AMD White Paper, “HyperTransport™ Technology: Simplifying System Design”, October 2002.] to get higher data rates. However, this comes at the cost of much more stringent design rules and restricted interconnect topologies.

The article “Package Level Interconnect Options” by J Balachandran et al, Proceedings of the 2005 International Workshop on System-Level Interconnect Prediction, San Francisco, USA, pages 21-27, describes the performance problems of conventional on-chip interconnects, and proposes a solution based on transmission lines at the package level. Whilst the use of transmission lines can assist in reducing parasitic effects, they are point-to-point and hence need careful routing. Additionally they need careful matching of impedances and careful layout to avoid reflections.

As an alternative to interconnect designs based on electrical conduction through wires, radio connectivity has been proposed in a few research papers as a means for communication on chips. Such existing radio frequency (RF) interconnection teachings specify dedicated structures, such as microstrip transmission lines (MTLs) or coplanar waveguides (CPWs), formed in the standard chip metallization or PCB track structures. In accordance with an MTL design, a narrow conductor is laid out between desired components and the waveguide is then formed between the conductor and an underlying (or overlying) ground layer to allow transmission of RF signals along the route defined by the path of the conductor. In accordance with a CPW design, a narrow conductor is again laid out between desired components, but in contrast to MTL designs the ground layer is provided adjacent the conductor in the same plane as the conductor. Accordingly, such MTL and CPW waveguides define a guided medium for the transmission of RF energy.

M. F. Chang et al., in the article “RF/Wireless Interconnect for Inter- and Intra-Chip Communications” Proceedings of the IEEE Vol. 89, No. 4, April 2001, describes a coplanar waveguide interconnect capable of allowing multiple I/Os to communicate simultaneously using multicarrier Code Division Multiple Access (CDMA) algorithms. In the article “Advanced RF/Baseband Interconnect Schemes for Inter- and Intra-ULSI Communications, by M. F. Chang, IEEE Transactions on Electron Devices, Vol 52, No 7, July 2005, pages 1271-1285, a number of interconnect schemes for Ultra Large Scale Integration (ULSI) interconnect systems are described, including CDMA, Frequency Division Multiple Access (FDMA) and single carrier RF schemes. A wireless multi-carrier CDMA interconnect scheme is also described, which is used as a miniature wireless local area network (LAN) located inside a SIP (System in Package, i.e. a complete system integrated onto one or more chips but in the same package). This miniature LAN contains ULSI I/O devices as users, capacitor couplers as near field antennas, RF transceivers and an off-chip but in-package MTL waveguide as a shared broadcasting medium. The paper indicates that combined FDMA/CDMA techniques can be used to alleviate cross-channel interference in the shared MTL waveguide.

Whilst the MTL waveguide can be shared amongst multiple users, the narrow conductor of the MTL waveguide still needs to be routed between the various components to be coupled to the waveguide.

The article "A 5.6-mW 1-Gb/s/pair Pulsed Signalling Transceiver for a Fully AC Coupled Bus" by J Kim et al, IEEE Journal of Solid-State Circuits, Vol 40, No 6, June 2005, pages 1331-1340, describes a low power synchronous pulsed signalling scheme using ac coupling for board-level chip-to-chip communications. An MTL waveguide (called a microstrip line therein) is used for the communication, requiring routing between each component in a serial, point-to-point fashion.

"Proximity Communication" by Robert J. Drost, Robert David Hopkins and Ivan E. Sutherland of Sun Microsystems Inc. describes a multi-chip module design where chips within the module communicate using capacitive coupling. European patent application number EP1587141 describes the uses of capacitive coupling in more detail.

All of the above proposals have discussed using MTL or CPW waveguides between specific regions of a chip. All of these devices are directed to replacing the current point-to-point bus networks with a high-speed RF equivalent network arrangement. As such, whilst such techniques can alleviate the earlier mentioned resistance and capacitance problems exhibited in traditional interconnect systems based on electrical conduction through wired connections, they still give rise to routing issues due to the need to specifically route the conductor of the waveguide between the various components that are to communicate via that waveguide. Hence, the design of such interconnects is still relatively complex. Accordingly it would be desirable to provide an improved interconnect design.

Outside of the field of interconnect technology, Zhao, D., Upadhyaya, S. and Margala, M., in the article "A New Distributed Test Control Architecture with Multihop Wireless Test Connectivity and Communication for GigaHertz Systems-Chips", 12th IEEE North Atlantic Test Workshop, Montauk, N.Y., May 2003, and Margala M in the research proposal of University of Buffalo "A New Test Control Architecture for Future SoCs Using On-chip Wireless Communication", describe the use of RF in free space to communicate with a chip for test purposes.

SUMMARY

According to a first aspect there is provided a bus interconnect device comprising a parallel-plate waveguide for coupling together a plurality of devices.

A parallel-plate waveguide may be viewed as a pair of waveguides with axes normal to the plane, the fundamental mode of which is a planar wave. In one embodiment broadband excitation of multiple modes from a localised source is used, and the initial propagation from a very short duration pulse would be cylindrical. The waves are radiated between the plates in two dimensions, allowing direct communication between any pair of devices coupled into the waveguide. Typically the width of the plates is considerably larger than the distance between the plates.

The use of parallel plates removes the requirement to specifically route a conductor between the various devices that are to use the waveguide. Instead the devices merely need to be coupled into the waveguide at an arbitrary location within one of the parallel plates, and thereafter can transmit signals to, and receive signals from, any other device coupled into the waveguide. This approach hence alleviates the layout complexity associated with prior art MTL or CPW techniques.

Devices can be coupled into the parallel plate waveguide using any of a number of known techniques, for example using capacitive couplers or current loop devices which induce or receive signals that propagate in the waveguide. Alternatively a simple via can be used. In one embodiment, the bus interconnect device comprises at least one via for coupling a device in to the parallel plate waveguide.

The signals can be propagated through the parallel plate waveguide using a number of different communication protocols. However, in one embodiment, the plurality of devices are arranged to communicate via signals propagated through the parallel plate waveguide using an ultra wideband (UWB) communication protocol. UWB is a communication technique based on transmitting very short duration pulses, often of duration of only nanoseconds or less, whereby the occupied bandwidth goes to very large values. It has been found that when used in parallel plate waveguides of embodiments of the present invention, such UWB signals are resistant to multipath interference, such as occurs due to reflections occurring at the extremities of the parallel plates and off objects such as antennae protruding into the gap between the parallel plates.

In one embodiment, when using UWB communication, coupling into the waveguide can be achieved using specially formed UWB impulse antennae.

A variety of frequencies can be used for the signals propagated through the parallel plate waveguide. In one embodiment RF signals are used. In an alternative embodiment optical signals are used, which further improve speed of communication. It has been found that the parallel plate waveguide structure of interconnect used in embodiments of the present invention facilitates use of optical signals.

According to a second aspect there is provided a chip comprising a plurality of functional blocks coupled together by a bus interconnect device according to the first aspect of the present invention, i.e. including a parallel plate waveguide interconnect.

In one embodiment, devices which communicate through the interconnect are provided with a transmitter and/or a receiver coupled to an antenna disposed within the waveguide. Devices broadcast a signal, via the transmitter, using any appropriate communication protocol within the waveguide. The signal may be received by any device connected to the waveguide. Point to point communications are obviated, providing a simplified interconnect system and method.

In one embodiment, existing infrastructure of the chip is used to form the parallel plate waveguide. This may for example be existing packaging of the chip or an existing power distribution infrastructure. In such embodiments the parallel plate waveguide can be added to the design with minimal overhead. In an alternative embodiment a power distribution infrastructure of the chip is replicated to form the parallel plate waveguide. In this embodiment the parallel plate waveguide is hence formed using the same structure as that used for the power distribution infrastructure, and hence may be fabricated as part of the same process. However, the provision of a separate waveguide avoids any noise issues that may arise when using the same structure as used for power distribution.

The power distribution infrastructure can take a variety of forms, but often within a chip will not be formed of conductive plates. Nevertheless, at certain frequencies, the power distribution infrastructure may appear to be formed by parallel conductive plates, and hence if those frequencies are used to propagate signals between devices, the power distribution infrastructure can be used to form the parallel plate waveguide interconnect of embodiments of the present invention.

In one embodiment, the plurality of functional blocks comprise an array of processing elements, thereby forming a multicore S-o-C device. In one particular embodiment, the plurality of functional blocks are further coupled via a wired bus network, with the parallel plate waveguide being used for global communication amongst the array of processing elements. This embodiment hence enables fast global communications to be broadcast to all the elements simultaneously via the parallel plate waveguide, whilst inter-neighbour communication can take place via the wired bus network. In such an embodiment the combination of conventional wired interconnect technology with the parallel plate waveguide technique is particularly beneficial.

According to a third aspect there is provided a multi-chip module comprising a plurality of chips mounted on a substrate, the substrate including a bus interconnect device according to the first aspect of the present invention, i.e. including a parallel plate waveguide interconnect.

The parallel plate waveguide interconnect may be constructed between and using the existing power planes of the multi-chip module substrate, or alternatively the power planes may be replicated to form the parallel plate waveguide.

According to a fourth aspect there is provided a printed circuit board (PCB) for receiving at least one chip, the PCB comprising a bus interconnect device according to the first aspect of the present invention, i.e. including a parallel plate waveguide interconnect.

The parallel plate waveguide interconnect may be constructed between and using the existing power planes of the PCB, or alternatively the power planes may be replicated to form the parallel plate waveguide.

According to a fifth aspect there is provided a microprocessor or microprocessor peripheral device including a bus interconnect device according to the first aspect of the present invention, i.e. including a parallel-plate waveguide interconnect.

Example embodiments use ultra-wideband (UWB) impulse radio frequency signals within a shared parallel plate waveguide as the physical layer for a new system-wide interconnect technology. Large IP Blocks (for example, the discrete devices which together form the system of a S-o-C device) can then share this medium by simply tapping into the waveguide. The blocks can then simultaneously communicate at high data rates using techniques such as CDMA, direct sequence techniques.

In one embodiment, a parallel plate waveguide is formed of two layers of metal. For a chip, this could be between two of the conventional metal layers or may be even the gap between the top of the chip and the package lid. PCBs already have a ready-made waveguide in the form of the power planes.

As geometries of electrical circuitry shrink and clock frequencies increase, parasitic (second- and higher-order) effects become increasingly significant. Conventional dc-based square wave signalling becomes difficult to implement. Unwanted interaction between signal lines is difficult to model or control and leads to excessively conservative designs, low yields or even failures. The latency of the interconnect is dominated by parasitic losses rather than propagation delay and the extra buffering used to minimise this delay increases the power consumption of the interconnect, and therefore of devices using these interconnects. Data coherency at different points in a system is also difficult to achieve because of these delays. Embodiments of the present invention alleviate these problems by using wireless propagation to avoid the parasitic losses of conduction which are a feature of the prior art systems.

Conventional interconnection techniques require a significant amount of extra effort at the physical layout stage to buffer the data paths adequately and to remove skew between clock and data. Routing is complex and expensive in the number of layers required by a modern S-o-C. One advantage of embodiments of the present invention is that a pre-existing structure of PCBs and multi-chip modules can be used as a ubiquitous communications resource which can be tapped into from any position in a multi-chip system.

Example embodiments provide an interconnect system and method with a propagation speed approaching the speed of light in the substrate material. Signals are broadcast over a physical layer, thus removing the need for complex routing. Furthermore, as all receivers effectively see data at the same time, problems of data coherency are minimised.

Example embodiments comprise a shared parallel-plate waveguide, which may be for example formed by the power planes of a PCB or multi-chip module, one or more transmitters, each of which couple to an antenna in the waveguide, and one or more receivers, each of which couple to an antenna in the waveguide. The antennae can be capacitive couplers or current loop devices which induce or receive signals that propagate in the waveguide. Signals are broadcast from a transmitter and are detected by all receivers. Any known techniques for separating channels, such as CDMA, FDMA or collision detection, can be used.

Example embodiments can be implemented on, amongst other devices, an integrated circuit, a multi-core chip, a multi-chip module, or PCB. By employing well-known RF impedance matching techniques, communication can be enabled across multiple mediums.

The implementation of one embodiment uses ultra wide band (impulse) signalling, which is known to reduce multi-path effects and which can use simple transmitter circuitry.

Example embodiments alleviate the issues of interconnect speed and latency by using RF or optical propagation to avoid the parasitic losses of conventional tracks. Certain embodiments also ease the layout task by providing a global communications resource that can be tapped into from any block in a multi-chip system.

DESCRIPTION OF EXAMPLE EMBODIMENTS

Figure 1:
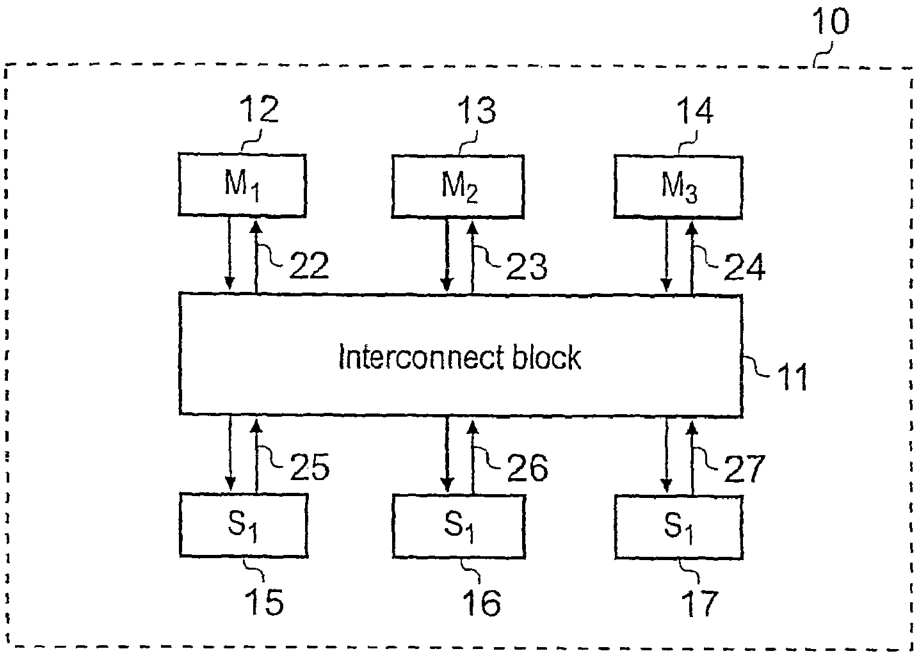
Fig. 1 (Prior Art)
FIG. 1 shows a conventional S-o-C system employing a conventional bus architecture.

For example, FIG. 1 illustrates a data processing apparatus in the form of a System-on-Chip (S-o-C), which may be used within a device such as a personal organiser, a mobile phone, a television set-top box, etc. The S-o-C 10 has a plurality of devices or functional blocks (also known as IP blocks) 12, 13, 14, 15, 16, 17 that are interconnected by an arrangement of buses. The actual interconnection of these buses is specified within an interconnect block 11. The interconnect block 11 includes a matrix of connections which provides for the interconnection of multiple bus master devices and bus slave devices within the S-o-C 10.

Hence, each master device 12, 13, 14 may be connected to corresponding buses 22, 23, 24 respectively, whilst each slave device 15, 16, 17 may also be connected to corresponding buses 25, 26, 27 respectively, with the interconnect block 11 defining how these various buses are interconnected.

The buses interconnecting the various elements will typically operate in accordance with a specified bus protocol, and hence for example may operate in accordance with the "Advanced Microcontroller Bus Architecture" (AMBA) specification developed by ARM Limited.

Accordingly, it will be appreciated that the interconnect block 11 will describe a complex arrangement of interconnections between various master and slave devices.

Figure 2:
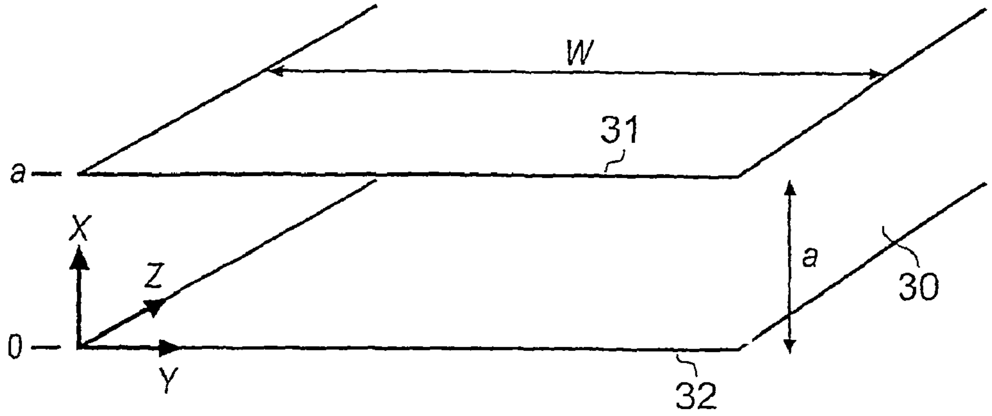
Fig. 2 (Prior Art)
FIG. 2 shows a parallel plate waveguide.

FIG. 2 illustrates a prior art parallel plate waveguide 30 comprising two parallel plates 31, 32 where the width w of the plates 31, 32 is considerably larger than the distance between the plates a. As is well known in the art, the fundamental mode of the parallel plate waveguide is a planar wave between the plates with the electric field perpendicular to the plates. This mode has a normalized propagation constant that is always equal to one, provided that the material between the plates is free space, as illustrated in FIG. 2.

In the paper "Novel Technology Eliminates High Frequency Noise in Parallel Plate Power Planes" by S Rogers, Etenna Corporation, presented at Bluetooth Americas, San Jose, Calif., USA, December 2003, the presence of digital switching noise propagating as undesirable voltage fluctuations across a power plane in a system is discussed. In particular it is noted that the power plane acts as a parallel plate waveguide to propagate this undesirable noise, one source of this noise being from signal lines that pass through vias in the power planes. Such interference between vias bound by power planes is in this paper seen as a serious parasitic effect. In the paper a technique is described for suppressing such power plane noise. The article "Physics-Based CAD Models for the analysis of Vias in Parallel Plate Environments" by R Abhari et al, IEEE Transactions on Microwave Theory and Techniques, Vol 49, No 10, October 2001, pages 1697-1707, discusses techniques for analysing the effect of noise introduced by vias passing through parallel plates, again with the view to avoiding such noise.

In accordance with example embodiments, the inventors realised that rather than trying to avoid parallel plate waveguide propagation occurring in a data processing apparatus, such parallel plate waveguide mechanisms can be used as an effective and flexible technique for implementing interconnect functionality in a data processing apparatus.

The parallel plate waveguide interconnects of embodiments of the present invention employ a dielectric material between the two plates of the waveguide. It will be appreciated that a plane wave by itself does not carry information and that it is necessary to have a frequency spectrum of finite size, as obtained by modulation of the plane wave, for instance. It will also be appreciated that information does not travel at the guide phase velocity, but rather propagates according to the group velocity, which is always less than the corresponding phase velocity in the given dielectric medium.

The group and phase velocities for each mode propagating in the waveguide are frequency dependent. This means that frequency components of a broadband signal travel at different speed and change their phase relationship as they propagate along the waveguide. The group and phase velocities of the modes are also mode dependent. This means that if a signal is distributed over a number of different modes, the components spread out over time during propagation, a phenomenon known as dispersion. Further information about the nature of parallel plate waveguides may be found in "Field Theory of Guided Waves", Second edition, 1990, R E Collin, John Wiley & Sons Inc, ISBN: 0879422378, incorporated herein by reference.

Figure 3:
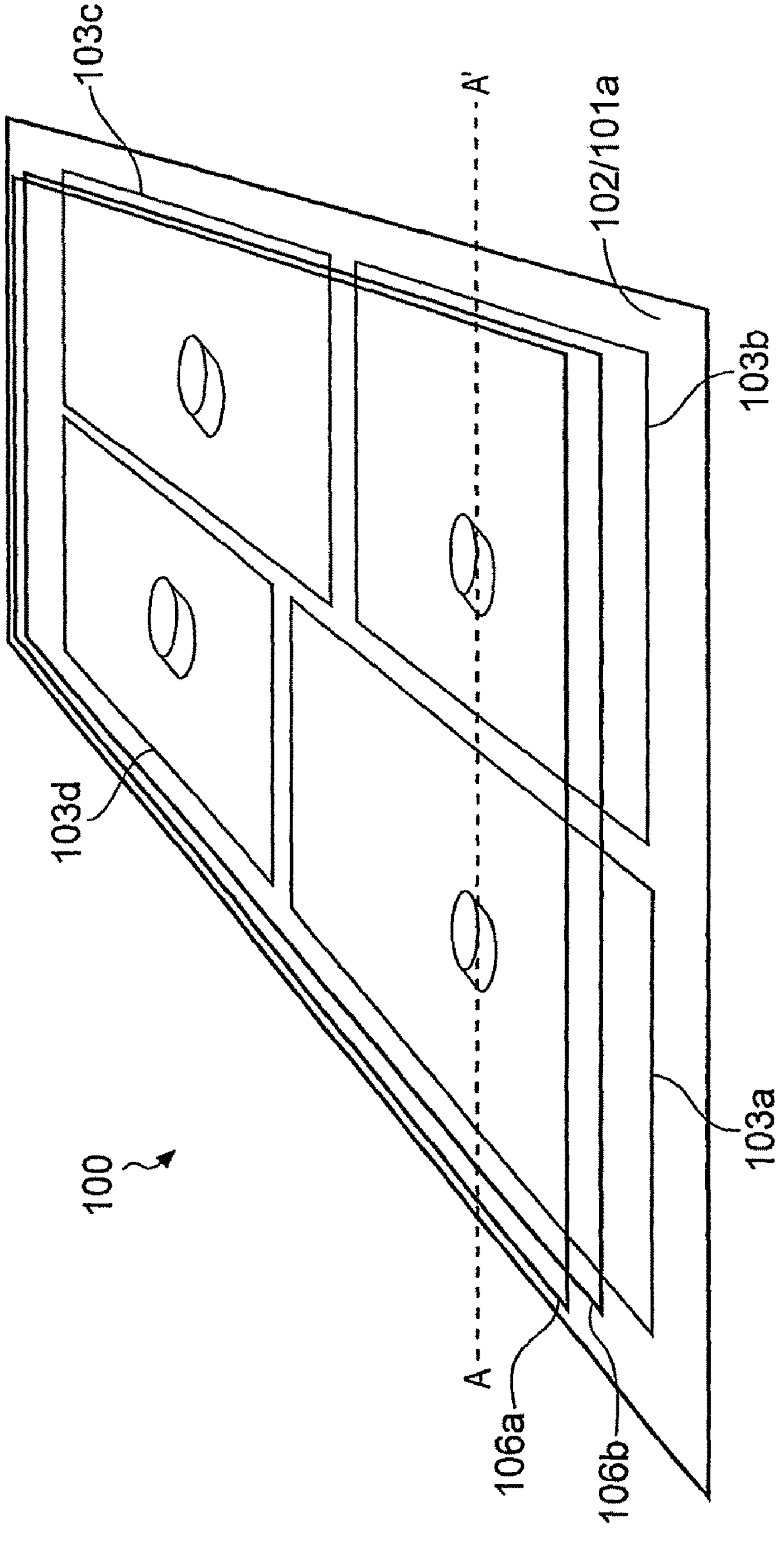
FIG. 3 shows a chip incorporating a parallel plate waveguide interconnect in accordance with one example embodiment.

FIG. 3 illustrates in outline a S-o-C device 100 incorporating a parallel plate waveguide interconnect according to an example embodiment. The chip comprises a substrate 102, formed on a support structure 101*a*, and functional blocks 103*a*, 103*b*, 103*c*, 103*d* which in combination form the S-o-C device. The periphery of the chip is typically left clear for a standard pad-ring. The functional blocks of this embodiment of the present invention may form master and slave devices, but the complex bus structure and block interconnect device of the prior art is replaced by a parallel plate waveguide interconnect. The functional blocks are coupled by vias (not shown) to antennas (see 105*a*, 105*b* in FIG. 4) into the interconnect, which is formed by parallel plates 106*a* and 106*b*. The line A-A' illustrates the cross section taken for FIG. 4.

Figure 4:
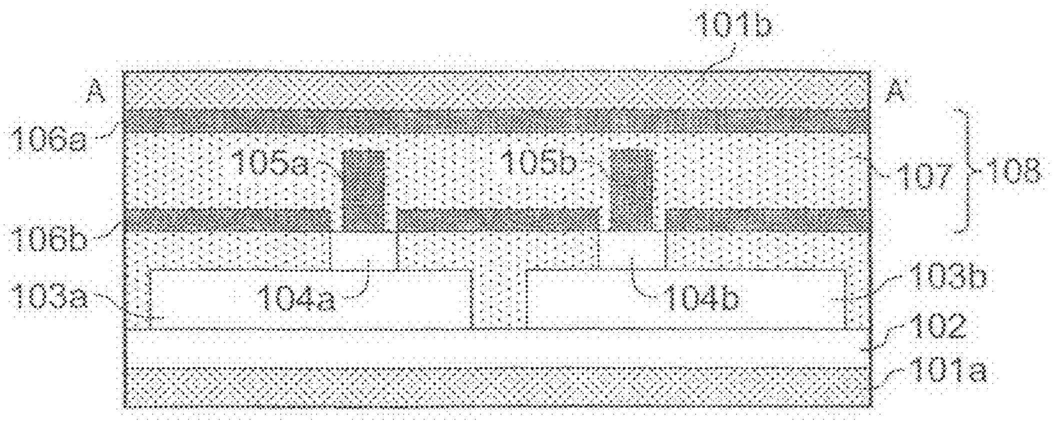
FIG. 4 shows a chip incorporating a parallel plate waveguide interconnect in cross section, in accordance with one example embodiment.

FIG. 4 illustrates a cross section of a chip 100 incorporating a parallel plate waveguide interconnect according to an example embodiment. The chip comprises outer support structures 101*a* and 101*b*, between which structures are sandwiched the layers of materials of the S-o-C device, as is well known in the art. A substrate layer 102 supports blocks 103*a* and 103*b* which in combination with elements 103*c* and 103*d* shown in FIG. 3 form the S-o-C device. The blocks are coupled by vias 104*a* and 104*b* to antennas 105*a* and 105*b* into the interconnect, which is formed by parallel plates 106*a* and 106*b*, which are in turn separated by dielectric material 107. The plates (106*a*, 106*b*) and the dielectric material (107) in combination form the waveguide interconnect 108, which may extend over a significant portion of the chip, and which replaces the bus and interconnect block structure of the prior art.

Figure 5:
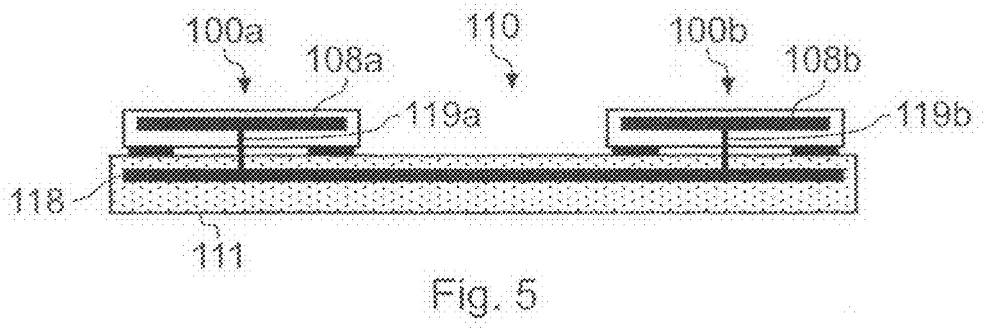
FIG. 5 shows a multi-chip module incorporating a parallel-plate waveguide interconnect in accordance with one example embodiment.

FIG. 5 shows a multi-chip module (MCM) 110 according to one example embodiment. Two chips 100*a* and 100*b* are mounted onto a module substrate 111, which contains a parallel plate waveguide interconnect 118 of the type described previously, comprising two parallel plates separated by a dielectric material. A via and antenna combination 119*a* connects the waveguide interconnect 108*a* of S-o-C device 100*a* to the module interconnect 118. Similarly, a via and antenna combination 119*b* connects the waveguide interconnect 108*b* of S-o-C device 100*b* to the module interconnect 118.

Figure 6:
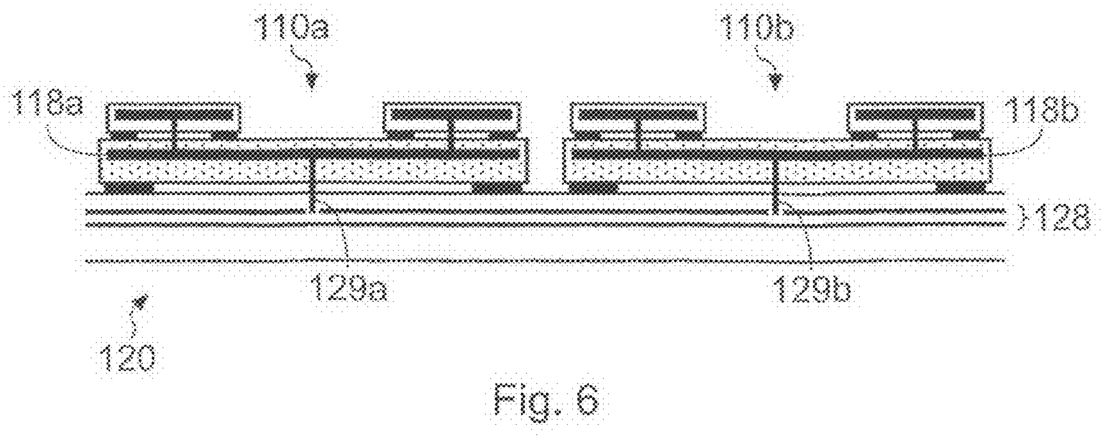
FIG. 6 shows a PCB with a parallel-plate waveguide interconnect in accordance with one example embodiment.

FIG. 6 shows a PCB structure 120 according to one example embodiment. Two multi-chip modules 110*a* and 110*b* are mounted into the PCB 120, which also contains a parallel plate waveguide interconnect 128 of the type described previously, comprising two parallel plates separated by a dielectric material. A via and antenna combination 129*a* connects the waveguide interconnect 118*a* of MCM 110*a* to the PCB interconnect 128. Similarly, a via and antenna combination 129*b* connects the waveguide interconnect 118*b* of MCM 110*b* to the module interconnect 128.

As another example of an example embodiment, it is known when developing a multicore S-o-C device, i.e. a device having multiple processors on a single chip, to arrange the multiple processors as an array of processing elements on the chip, this design often being referred to as a mesh of processing elements. In one example, the elements connect with their immediate neighbours using a bus network designed using conventional wired interconnect technology. This topology works well for some problems where the data can be streamed through the processing elements. However, any global communication has to pass through a number of elements in order to reach all the elements. Other topologies have been proposed to alleviate this problem (e.g. row and column bus structures) but none is entirely satisfactory.

Figure 7:
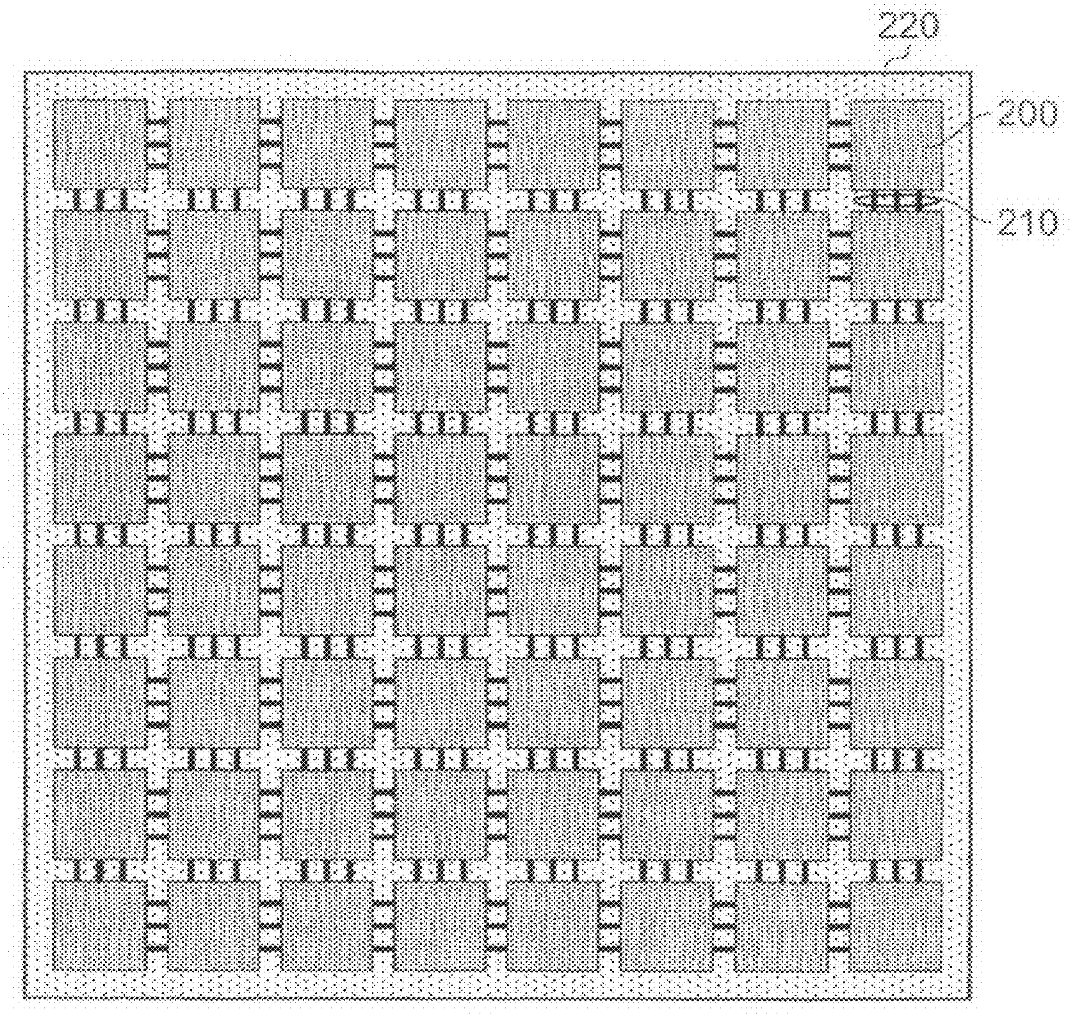
FIG. 7 shows a multicore S-o-C device incorporating a parallel plate waveguide interconnect in accordance with one example embodiment.

FIG. 7 shows a multicore device in accordance with one example embodiment, having an array of processing elements 200 connected in the above-described manner via a conventional wired interconnect bus network 210. Also shown is a parallel plate waveguide 220 that provides a global communications medium for all the processing elements. This embodiment confers several advantages over the existing art: fast global communication, data and instructions can be broadcast to all the elements simultaneously via the parallel plate waveguide 220, and additionally results can be returned without interfering with the inter-neighbour communication which can continue to take place via the wired interconnect 210. This embodiment is hence a good example of where the combination of conventional wired interconnect technology with the parallel plate waveguide technique of the present invention provides a good solution to an existing problem.

The inventors realised that the complex bus and block interconnect of the prior art may be replaced by a parallel plate waveguide interconnect such as that described above with reference to FIGS. 3 to 7. An advantage realised in such example embodiments is that the waveguide interconnect mechanism of such embodiments may be replicated and scaled according to the needs of the product designer.

The parallel plate waveguide is a dispersion device and it is therefore particularly appropriate to apply communication techniques which are used for broadcasting signals, such as CDMA. By allowing all devices (connected by a via and antenna structure to the waveguide interconnect) to broadcast to all other devices the need for point to point communication between master and slave units is removed. It is envisaged that, for example, a master device on one S-o-C chip may communicate with a slave device on another S-o-C through either the interconnect on an MCM or the interconnect on a PCB, or both, and vice versa.

From the above description, it will be appreciated that example embodiments provide a shared parallel plate waveguide interconnect that can be used for inter-chip and intra-chip communications, providing a very flexible and efficient communication mechanism.

At a particular level in the system, for example at the chip level, the MCM level, or the PCB level, a single parallel plate waveguide may be used as discussed earlier. Alternatively, more than one parallel plate waveguide could be used at a particular level, such that for example each waveguide was associated with a distinct region. Such an approach could be used to increase overall bandwidth.

Whilst the parallel plate waveguide interconnect of example embodiments could be used to entirely replace a prior art wired interconnect block such as that discussed earlier with reference to FIG. 1, in alternative embodiments the parallel plate waveguide could be used to only partially replace the functionality of such a wired interconnect block. In such an embodiment, an adapter block could be provided between the wired interconnect block and the parallel plate waveguide interconnect to convert signals between the communication formats used by the respective interconnect mechanisms.

Although example embodiments have been described herein, it will be appreciated that the claims are not limited thereto and that many modifications and additions thereto may be made within the scope of the claims.

The invention claimed is:

1. A data processing chip comprising:

a bus interconnect device formed of a parallel plate waveguide comprising parallel plates, said parallel plates separated by a distance in a first dimension orthogonal to said plates, said plates extending in second and third dimensions, said second and third dimensions orthogonal to each other;

a plurality of at least three devices forming a plurality of functional blocks of the data processing chip that are coupled together by the bus interconnect device, each device being coupled into the parallel plate waveguide at a chosen location within one of the parallel plates, wherein the relative positioning of each device with respect to the other at least two devices is arbitrary in said second and third dimensions;

said plurality of at least three devices being arranged to communicate via radio frequency (RF) signals propagated through the parallel plate waveguide as waves radiated between the parallel plates in said second and third dimensions, allowing direct simultaneous communications between devices of said at least three devices, wherein:

the plurality of functional blocks includes an array of processing elements, the plurality of functional blocks being further coupled via a wired bus network, the parallel plate waveguide is useable for global communication among the array of processing elements, and the wired bus network is useable for inter-neighbor communication between the processing elements.

2. A data processing chip as claimed in claim 1 further comprising at least one via for coupling a device into the parallel plate waveguide.

3. A data processing chip as claimed in claim 1, wherein said plurality of devices are arranged to communicate via signals propagated through the parallel plate waveguide using an ultra wideband communication protocol.

4. A data processing chip as claimed in claim 1, wherein the functional blocks are connected to the bus interconnect device by a transmitter or a receiver coupled to an antenna disposed within the parallel plate waveguide.

5. A chip as claimed in claim 1, wherein one of said functional blocks comprises a microprocessor or microprocessor peripheral device.

6. A chip as claimed in claim 1, wherein the parallel plate waveguide comprises existing infrastructure of the data processing chip.

7. A data processing chip as claimed in claim 1, wherein the existing infrastructure is an existing power distribution infrastructure.

8. A multi-chip module comprising a plurality of chips mounted on a substrate, the multi-chip module comprising:

a bus interconnect device provided in the substrate and formed of a parallel plate waveguide comprising parallel plates, said parallel plates separated by a distance in a first dimension orthogonal to said plates, said plates extending in second and third dimensions, said second and third dimensions orthogonal to each other;

a plurality of at least three devices forming a plurality of chips of the multi-chip module that are coupled together by the bus interconnect device, each device being coupled into the parallel plate waveguide at a chosen location within one of the parallel plates, wherein the relative positioning of each device with respect to the other at least two devices is arbitrary in said second and third dimensions;

said plurality of at least three devices being arranged to communicate via radio frequency (RF) signals propagated through the parallel plate waveguide as waves radiated between the parallel plates in said second and third dimensions, allowing direct simultaneous communications between devices of said at least three devices, wherein:

the plurality of chips includes an array of processing elements, the plurality of chips being further coupled via a wired bus network, the parallel plate waveguide is useable for global communication among the array of processing elements, and the wired bus network is useable for inter-neighbor communication between the processing elements.

9. A multi-chip module as claimed in claim 8, wherein the parallel plate waveguide is constructed using existing power planes of the multi-chip module substrate.

10. A multi-chip module as claimed in claim 8, wherein the parallel plate waveguide comprises existing infrastructure of the multi-chip module.

11. A printed circuit board (PCB) for receiving a plurality of chips, the PCB comprising:

a bus interconnect device formed of a parallel plate waveguide comprising parallel plates, said parallel plates separated by a distance in a first dimension orthogonal to said plates, said plates extending in second and third dimensions, said second and third dimensions orthogonal to each other;

a plurality of at least three devices forming a plurality of chips received by the PCB and coupled together by the bus interconnect device, each device being coupled into the parallel plate waveguide at a chosen location within one of the parallel plates, wherein the relative positioning of each device with respect to the other at least two devices is arbitrary in said second and third dimensions;

said plurality of at least three devices being arranged to communicate via radio frequency (RF) signals propagated through the parallel plate waveguide as waves radiated between the parallel plates in said second and third dimensions, allowing direct simultaneous communications between devices of said at least three devices, wherein;

the plurality of chips includes an array of processing elements, the plurality of chips being further coupled via a wired bus network, the parallel plate waveguide is useable for global communication among the array of processing elements, and the wired bus network is useable for inter-neighbor communication between the processing elements.

12. A PCB as claimed in claim 11, wherein the parallel plate waveguide is constructed using existing power planes of the PCB.

13. A PCB as claimed in claim 11, wherein the parallel plate waveguide comprises existing infrastructure of the PCB.

* * * * *